(12) United States Patent
Chen et al.

(10) Patent No.: US 11,496,066 B2
(45) Date of Patent: Nov. 8, 2022

(54) ALTERNATOR AND RECTIFIER THEREOF

(71) Applicant: ACTRON TECHNOLOGY CORPORATION, Taoyuan (TW)

(72) Inventors: Wei-Jing Chen, Taoyuan (TW); Shang-Shu Chung, Taoyuan (TW); Yen-Yi Chen, Taoyuan (TW); Huei-Chi Wang, Taoyuan (TW)

(73) Assignee: ACTRON TECHNOLOGY CORPORATION, Taoyuan (TW)

( * ) Notice: Subject to any disclaimer, the term of this patent is extended or adjusted under 35 U.S.C. 154(b) by 62 days.

(21) Appl. No.: 17/169,566

(22) Filed: Feb. 8, 2021

(65) Prior Publication Data

US 2022/0123649 A1 Apr. 21, 2022

(30) Foreign Application Priority Data

Oct. 20, 2020 (TW) ................... 109136194

(51) Int. Cl.
*H02M 7/219* (2006.01)
*H02M 1/08* (2006.01)

(52) U.S. Cl.
CPC .......... *H02M 7/2195* (2021.05); *H02M 1/08* (2013.01)

(58) Field of Classification Search
CPC .............................. H02M 7/2195; H02M 1/08
See application file for complete search history.

(56) References Cited

U.S. PATENT DOCUMENTS

| 8,400,790 | B2 | 3/2013 | Zhang et al. |
| 8,427,801 | B2 | 4/2013 | Goerlach et al. |
| 11,005,385 | B2* | 5/2021 | Chen ................... H02M 7/2195 |
| 2017/0110959 | A1 | 4/2017 | Ishimaru et al. |
| 2018/0167000 | A1 | 6/2018 | Pidutti et al. |
| 2019/0372477 | A1* | 12/2019 | Pidutti ................... H02M 1/08 |

FOREIGN PATENT DOCUMENTS

| CN | 1985427 | 6/2007 |
| JP | 2020114165 | 7/2020 |
| TW | I678876 | 12/2019 |
| TW | I692194 | 4/2020 |
| TW | 202027397 | 7/2020 |

* cited by examiner

*Primary Examiner* — Jue Zhang
(74) *Attorney, Agent, or Firm* — JCIPRNET

(57) ABSTRACT

An alternator and a rectifier thereof are provided. The rectifier includes a transistor and a gate voltage control circuit. A control end of the transistor receives a gate voltage. The gate voltage control circuit generates the gate voltage according to a voltage difference between an input voltage and a rectified voltage. The gate voltage control circuit detects a first time point when the voltage difference is less than a first preset threshold voltage, provides the gate voltage during a first time interval after the first time point to turn on the transistor, and sets the voltage difference to a first reference voltage. The gate voltage control circuit regulates the gate voltage to set the voltage difference to a second reference voltage during a second time interval after the first time interval. The first time interval is independent of a cycle of the input voltage.

10 Claims, 6 Drawing Sheets

ALTERNATOR AND RECTIFIER THEREOF

CROSS-REFERENCE TO RELATED APPLICATION

This application claims the priority benefit of Taiwan application serial no. 109136194, filed on Oct. 20, 2020. The entirety of the above-mentioned patent application is hereby incorporated by reference herein and made a part of this specification.

BACKGROUND

Technical Field

The disclosure relates to a rectifier, particularly to a rectifier capable of preventing reverse voltage.

DESCRIPTION OF RELATED ART

In an AC generator, a rectifier is often adapted to rectify the AC input voltage to generate a rectified voltage that can be regarded as a DC voltage. Conventionally, diodes or transistors are often adapted to rectify the input voltage. Ideally, during the negative half cycle of the rectified voltage, the voltage value remains equal to the reference voltage (for example, 0 volt). However, in actual situations such as the conventionally known rectified voltage shown in the waveform diagram of FIG. 1, the voltage value of the input voltage of the rectified voltage having a voltage VP as the peak value is less than the reference voltage V0 in its negative half wave TN. In other words, power is loss in the negative half cycle TN of the rectified voltage, decreasing the operational efficiency of the system.

Conventionally, the rectifier may be implemented by employing a transistor, and the rectification can be performed by actively turning the transistor on and off. However, if the time points of turning the transistor on and off are not well set, a reverse current may occur, causing a decrease in the performance of the system.

SUMMARY

The disclosure provides an alternator and a rectifier thereof, capable of preventing the occurrence of reverse current.

The rectifier includes a transistor and a gate voltage control circuit. The transistor has a first end receiving an AC input voltage, a second end generating a rectified voltage, and a control end receiving a gate voltage. The gate voltage control circuit is coupled to the transistor and generates the gate voltage according to the voltage difference between the input voltage and the rectified voltage. The gate voltage control circuit detects a first time point when the voltage difference is less than a first preset threshold voltage, provides the gate voltage during a first time interval after the first time point to turn on the transistor, and sets the voltage difference to be substantially equal to a first reference voltage. The gate voltage control circuit regulates the gate voltage to set the voltage difference substantially to a second reference voltage during a second time interval after the first time interval. The first time interval is independent of a cycle of the input voltage.

The alternator of the present disclosure includes a rotor, a stator, and multiple rectifiers as described above. The stator is coupled to the rotor. Each of the rectifiers respectively receives the corresponding input voltage. The rectifiers together generate the rectified voltage.

In light of the above, the gate voltage control circuit of the present disclosure rapidly turns on the transistor when the voltage difference between the two ends of the transistor is less than the first preset threshold voltage, and maintains the conductive state for a fixed first time interval. By regulating the conduction mechanism of the transistor, the rectifier of the present disclosure prevents the reverse current generated during the rectification.

DESCRIPTION OF THE EMBODIMENTS

Figure 1:
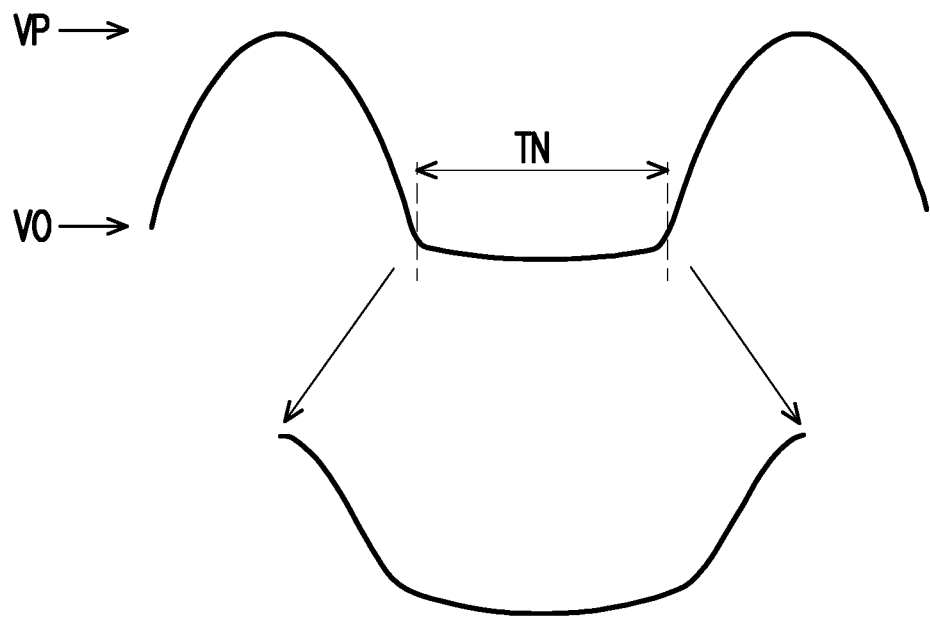
FIG. 1 is a waveform of the rectified voltage as conventionally known.
Figure 2:
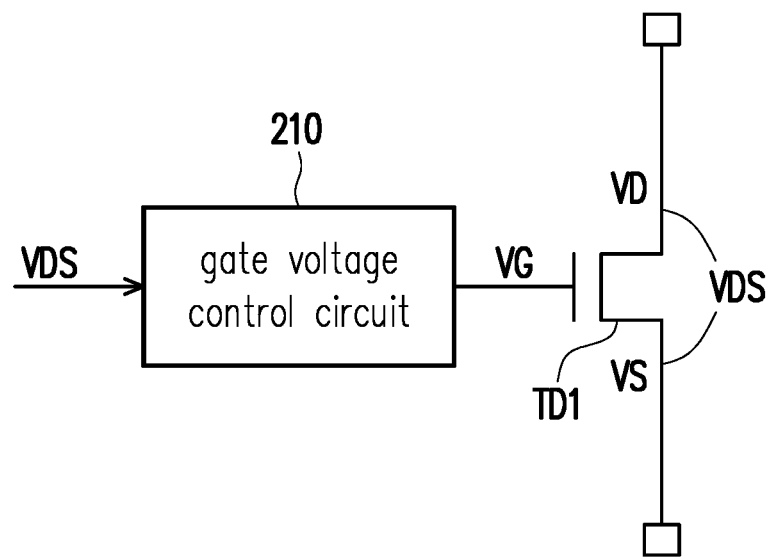
FIG. 2 is a schematic view of a rectifier according to an embodiment of the present disclosure.

FIG. 2 is a schematic view of a rectifier according to an embodiment of the present disclosure. A rectifier 200 includes a transistor TD1 and a gate voltage control circuit 210. The transistor TD1 has a first end receiving an input voltage VS, a second end generating a rectified voltage VD, and a control end receiving a gate voltage VG. In this embodiment, the operation of the transistor TD1 is equivalent to a diode via the gate voltage VG, in which the first end of the transistor TD1 is equivalent to the cathode of the diode, and the second end of the transistor TD1 is equivalent to the anode of the diode.

Figure 3:
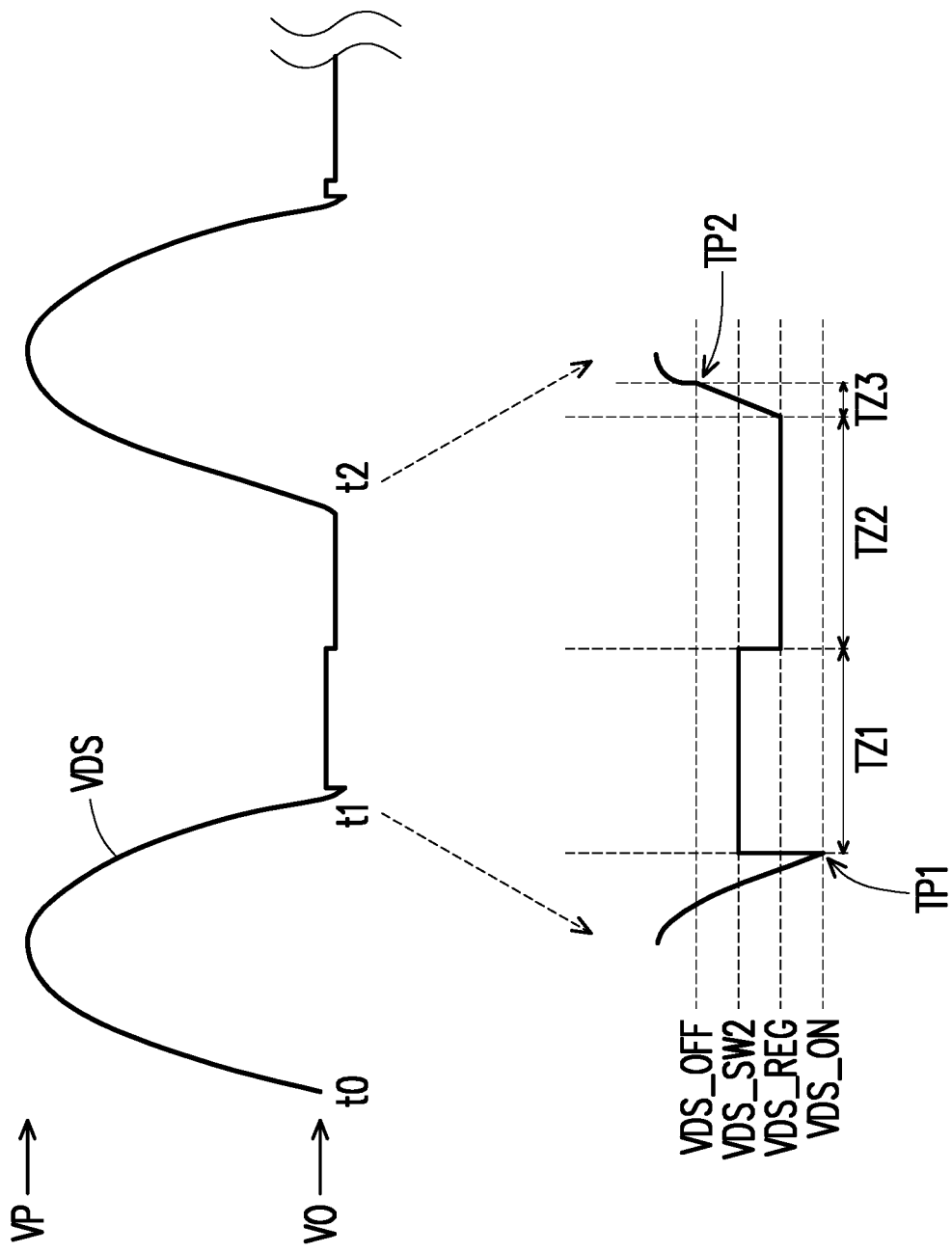
FIG. 3 illustrates a waveform when a rectifier according to an embodiment of the present disclosure operates.

The gate voltage control circuit 210 is coupled to the transistor TD1 and is adapted to provide the gate voltage VG. The gate voltage control circuit 210 receives a voltage difference VDS between the input voltage VS and the rectified voltage VD, and generates the gate voltage VG according to the voltage difference VDS. To describe the gate voltage VG in more detail, please refer to FIG. 2 and FIG. 3 at the same time, in which FIG. 3 illustrates a waveform when a rectifier according to an embodiment of the present disclosure operates. In FIG. 3, the voltage difference VDS has a peak value being a voltage VP, and has a reference voltage V0. The positive half cycle of the voltage difference VDS is between a time point t0 and a time point t1, whereas the negative half cycle of the voltage difference VDS is between the time point t1 and a time point t2. After the time point t1, the gate voltage control circuit 210 detects whether the voltage difference VDS is less than a first preset threshold voltage VDS_ON, and sets a first time point TP1 when the voltage difference VDS is less than the first preset threshold voltage VDS_ON.

When the first time point TP1 is detected, the gate voltage control circuit 210 may continuously provide the gate voltage VG during a first time interval TZ1 starting from the first time point TP1 for turning on the transistor TD1. By turning on the transistor TD1, the voltage difference VDS may be substantially equal to a first reference voltage VDS_SW2. Here, the first reference voltage VDS_SW2 may be the product of the on-state resistance of the transistor TD1 and the current flowing through the transistor TD1.

Then, during a second time interval TZ2 after the first time interval TZ1 ends, the gate voltage control circuit 210 keeps the voltage difference VDS at a second reference voltage VDS_REG by regulating the gate voltage VG. In this embodiment, the second reference voltage VDS_REG may be less than the first reference voltage VDS_SW2. In other embodiments of the present disclosure, the second reference voltage VDS_REG may be equal to or higher than the first reference voltage VDS_SW2, and the present disclosure is not limited thereto.

Note here that the length of the first time interval TZ1 is fixed. It may be further illustrated that the first time interval TZ1 and the cycle of the input voltage VS are independent of and not related to each other. The length of the first time interval TZ1 may be decided by the designer. And when the cycle of the input voltage VS changes, the first time interval TZ1 does not change accordingly.

Incidentally, in some embodiments of the present disclosure, the length of the first time interval TZ1 may be 0 second.

During a third time interval T3 after the second time interval TZ2, since the current flowing through the transistor TD1 decreases rapidly, which is accompanied by the regulation of the gate voltage VG, the voltage difference VDS starts to rise. The gate voltage control circuit 210 then detects the second time point TP2 when the voltage difference VDS rises till reaching the second preset threshold voltage VDS_OFF. After the second time point TP2, the gate voltage control circuit 210 regulates the gate voltage VG to turn off the transistor TD1.

In the present embodiment, the second preset threshold voltage VDS_OFF is greater than the first reference voltage VDS_SW2. Moreover, both the first reference voltage VDS_SW2 and the second reference voltage VDS_REG in this embodiment may be less than 0 volt, achieving the effect of a current protection level at a negative value.

Figure 4:
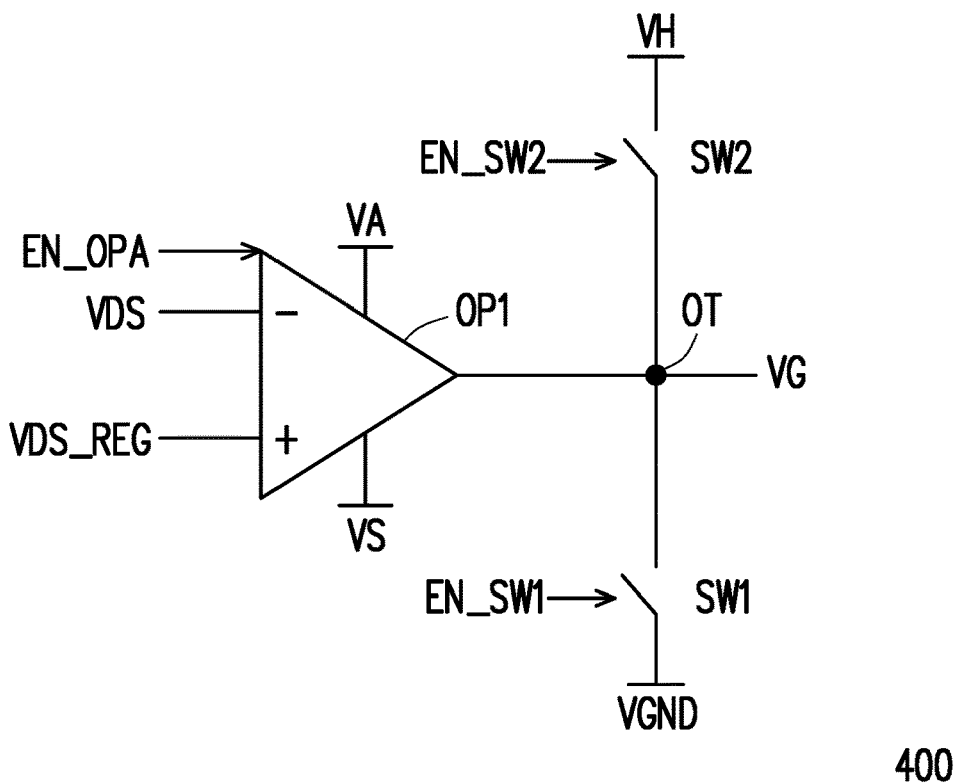
FIG. 4 is a schematic view of an implementation of a gate voltage control circuit according to an embodiment of the present disclosure.

Regarding the hardware architecture of the gate voltage control circuit 210, please refer to FIG. 4, which is a schematic view of an implementation of a gate voltage control circuit according to an embodiment of the present disclosure. A gate voltage control circuit 400 includes an operational amplifier OP1, a switch SW1, and a switch SW2. The operational amplifier OP1 receives a voltage difference VDS and an regulated voltage as a second reference voltage VDS_REG, and generates a gate voltage VG at an output terminal OT according to a control signal EN_OPA. In addition, the operational amplifier OP1 receives a power supply VA as an operational power supply, and receives a ground voltage VGND as a reference ground voltage. The switch SW2 is connected in series between a third reference voltage VH and an output terminal OT. The switch SW2 is turned on or off according to a control signal EN_SW2. The switch SW1 is connected in series between the ground voltage VGND and the output terminal OT. The switch SW1 is turned on or off according to a control signal EN_SW1. The positive and negative input terminals of the operational amplifier OP1 respectively receive the second reference voltage (that is, the regulated voltage) VDS_REG and the voltage difference VDS.

As in the embodiment of FIG. 3, when the gate voltage control circuit 400 detects the first time point TP1, which is when the voltage difference VDS is less than the first preset threshold voltage VDS_ON, it generates the control signal EN_SW2 to keep the switch SW2 turned on during the first time interval TZ1. At the same time, the switch SW1 is turned off according to the control signal EN_SW1, and the operational amplifier OP1 stops its operation (disabled) according to the control signal EN_OPA. The gate voltage VG at the output terminal OT of the gate voltage control circuit 400 is equal to the third reference voltage VH according to the turned on switch SW2, and the voltage value of the third reference voltage VH is greater than the voltage of the turned-on transistor TD1. At this time, the gate voltage VG makes the transistor TD1 turned on (for example, to be fully turned on), and the voltage difference VDS is limited to be equal to the first reference voltage VDS_SW2.

After the first time interval TZ1 which is maintained for a fixed length of time, during the second time interval TZ2, the gate voltage control circuit 400 turns off the switches SW1 and SW2 respectively by the generated control signals EN_SW1 and EN_SW2, and activates (enables) the operational amplifier OP1 by the control signal EN_OPA. At this time, the gate voltage VG is dominated by the operational amplifier OP1. The operational amplifier OP1 regulates the voltage difference VDS according to the second reference voltage VDS_REG, so that the voltage difference VDS may be equal to the second reference voltage VDS_REG.

In the time interval TZ3, as the current flowing through the transistor TD1 decreases and the gate voltage VG generated by the operational amplifier OP1 acts, the voltage difference VDS gradually rises. After the second time point TP2 when the voltage difference VDS rises to the second preset threshold voltage VDS_OFF, the gate voltage control circuit 400 turns off the switch SW2 via the control signal EN_SW2, and stops the operational amplifier OP1 from operating via the control signal EN_OPA; and the switch SW1 is turned on via the control signal EN_SW1. At this time, the gate voltage VG is pulled down to the ground voltage VGND via the turned-on switch SW1. The transistor TD1 is turned off according to the gate voltage VG at the ground voltage VGND.

The circuit of the operational amplifier OP1 in this embodiment can be implemented by using a differential amplifier familiar to those skilled in the art. And the switches SW1 and SW2 in this embodiment may be configured by using electronic components well known in the semiconductor field (such as transistors). The disclosure has no specific restriction thereto.

Figure 5:
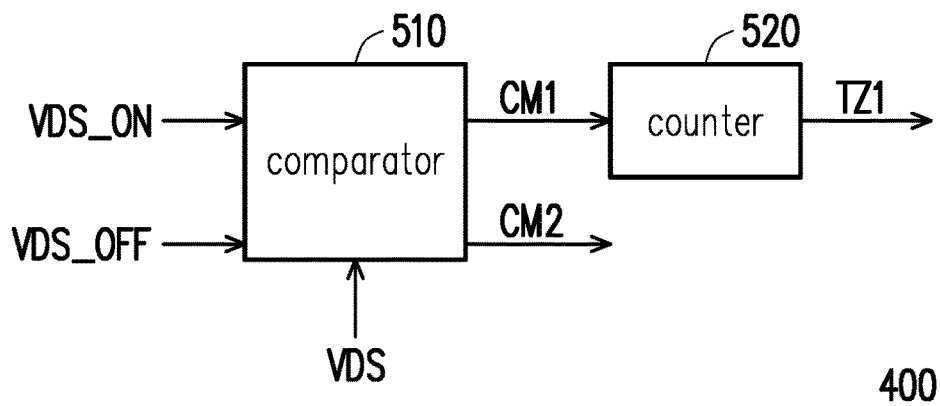
FIG. 5 is a schematic view of another part of the circuit of the gate voltage control circuit according to an embodiment of the present disclosure.

Please refer to FIG. 3 to FIG. 5 at the same time. FIG. 5 is a schematic view of another part of the circuit of the gate voltage control circuit according to an embodiment of the present disclosure. The gate voltage control circuit 400 further includes a comparator 510 and a counter 520. The comparator 510 receives the voltage difference VDS, the first preset threshold voltage VDS_ON, and the second preset threshold voltage VDS_OFF. Both the first preset threshold voltage VDS_ON and the second preset threshold voltage VDS_OFF may be preset voltage values. The comparator 510 may compare the voltage difference VDS with the first preset threshold voltage VDS_ON to generate a comparison result CM1, and compare the voltage difference VDS with the second preset threshold voltage VDS_OFF to generate a comparison result CM2. The comparison result CM1 may be configured to determine the first time point TP1, and the comparison result CM2 may be configured to determine the second time point TP2.

And the counter 520 performs a counting operation based on a clock signal. The counter 520 can initiate the counting operation according to the comparison result CM1. When the comparison result CM1 indicates the detection of the first time point TP1, the counter 520 initiates its counting operation. The counter 520 may have a preset counting target value, and when the counting result of the counter 520 is equal to the counting target value, the counting operation stops. The length of time during which the counter 520 performs the counting operation may be configured to define the first time interval TZ1.

Note that the counting target value mentioned above is a fixed value independent of the cycle of the input voltage VS.

Incidentally, the gate voltage control circuit 400 may generate the control signal EN_SW2 according to the first time interval TZ1 counted by the counter 520 to keep the switch SW2 turned on during the first time interval TZ1. The gate voltage control circuit 400 may generate a control signal EN_SW1 to turn on the switch SW1 according to the comparison result CM2. The gate voltage control circuit 400 may generate the control signal EN_OPA according to the comparison results CM1 and CM2, and keep the operational amplifier OP1 activated during the second time interval TZ2 (that is, the time interval between the end of the first time interval TZ1 and the second time point TP2).

Figure 6:
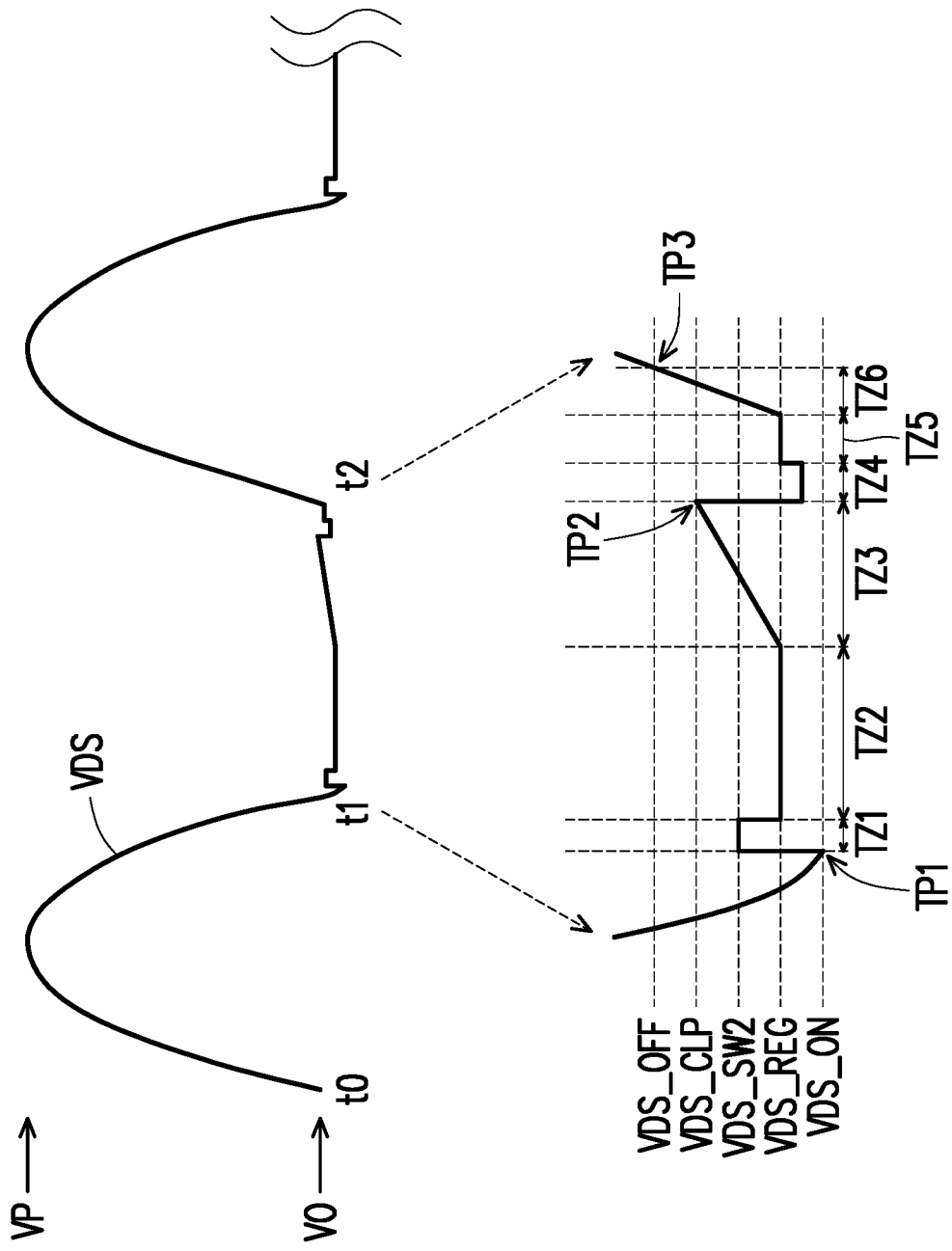
FIG. 6 illustrates a waveform when a rectifier according to another embodiment of the present disclosure operates.

Please refer to FIG. 2 and FIG. 6 at the same time. FIG. 6 illustrates a waveform when a rectifier according to an embodiment of the present disclosure operates. In FIG. 6, the gate voltage control circuit 210 determines the first time point TP1 when the voltage difference VDS drops to the first preset threshold voltage VDS_ON, and provides the gate voltage VG during the first time interval TZ1 to keep the transistor TD1 turned on. During the first time interval TZ1, the voltage difference VDS can be regulated to be substantially equal to the first reference voltage VDS_SW2. In this embodiment, the first time interval TZ1 can be maintained for a fixed length of time, and the fixed time length of time are independent of and not related to the cycle of the input voltage VS.

After the first time interval TZ1 ends, during the second time interval TZ2, the gate voltage control circuit 210 sets the gate voltage VG to the second reference voltage VDS_REG, and controls the transistor TD1 so that the voltage difference VDS in a steady state is equal to the second reference voltage VDS_REG. During the third time interval TZ3, according to the decreasing current flowing through the transistor TD1, and accompanied with the acting of the gate voltage VG, the voltage difference VDS gradually rises. The gate voltage control circuit 210 detects the second time point TP2 when the voltage difference VDS rises to be equal to a first clamping voltage VDS_CLP. After the second time point TP2, the gate voltage control circuit 210 enters a fourth time interval TZ4.

During the fourth time interval TZ4, the gate voltage control circuit 210 sets the gate voltage VG to a second clamping voltage VG_CLP. At this time, the transistor TD1 has a relatively high impedance according to the gate voltage VG which is equal to the second clamping voltage VG_CLP, allowing only a small amount of current to flow. At this time, the transistor TD1 can operate in a sub-critical or a saturation region. Since the transistor TD1 only allows a small amount of current to flow, the voltage difference VDS at this time is close to and slightly less than the second reference voltage VDS_REG. In other embodiments of the present disclosure, the voltage difference VDS at this time may also be slightly higher than the second reference voltage VDS_REG, to which the present disclosure is not limited.

Note here that the fourth time interval TZ4 may be maintained for a preset, fixed length of time. The length of time of the fourth time interval TZ4 can be decided by the designer, to which there is no certain limit.

After the fourth time interval TZ4 ends, during a fifth time interval TZ5, the gate voltage control circuit 210 may provide the gate voltage VG according to the difference between the second reference voltage VDS_REG and the voltage difference VDS, and set the voltage difference VDS in a steady state to be equal to the second reference voltage VDS_REG. Then, in a sixth time interval TZ6, the voltage difference VDS may rise rapidly. When the gate voltage control circuit 210 detects the third time point TP3 at which point the voltage difference VDS rises to the second preset threshold voltage VDS_OFF, the gate voltage control circuit 210 may pull down the voltage value of the gate voltage VG and turn off the transistor TD1.

Figure 7:
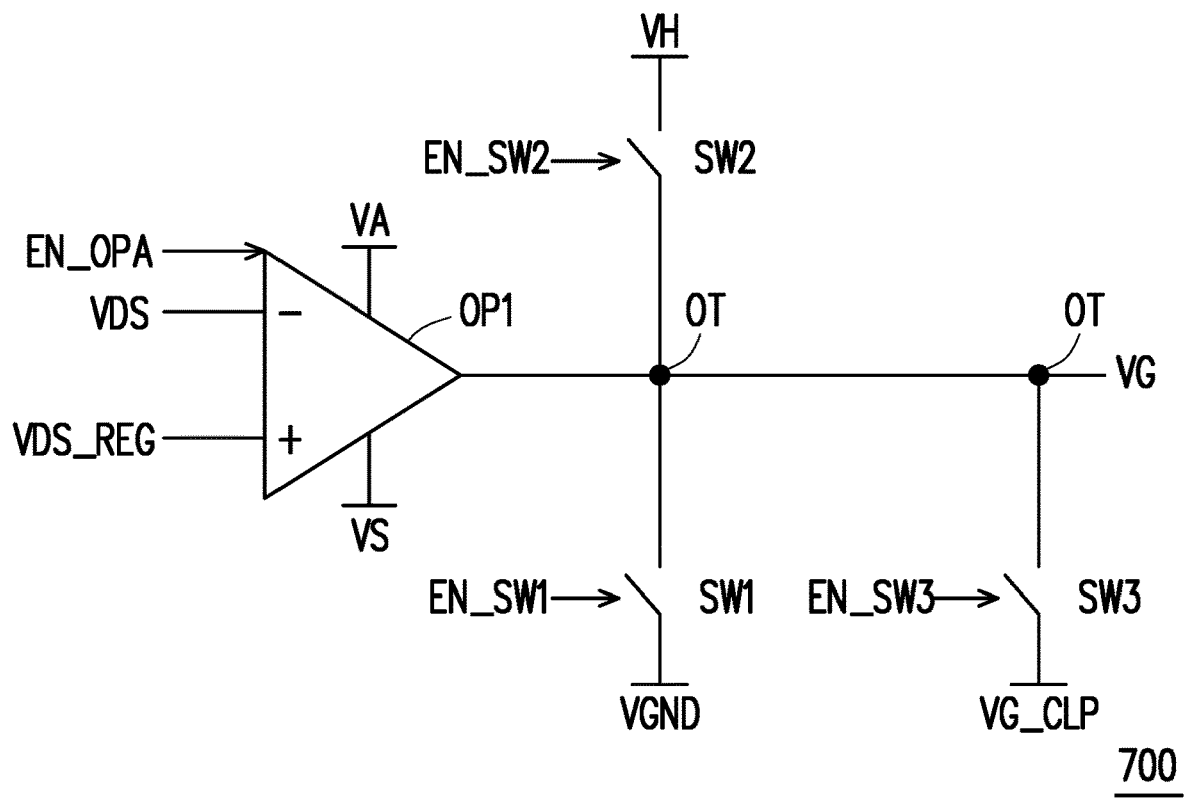
FIG. 7 is a schematic view of an implementation of a gate voltage control circuit according to another embodiment of the present disclosure.

Please refer to FIG. 6 to FIG. 7 at the same time. FIG. 7 is a schematic view of an implementation of a gate voltage control circuit according to another embodiment of the present disclosure. A gate voltage control circuit 700 includes an operational amplifier OP1, a switch SW1, a switch SW2, and a switch SW3. The operational amplifier OP1 receives a voltage difference VDS and an regulated voltage as a second reference voltage VDS_REG, and generates a gate voltage VG at an output terminal OT according to a control signal EN_OPA. In addition, the operational amplifier OP1 receives a power supply VA as an operational power supply, and receives a ground voltage VGND as a reference ground voltage. The switch SW2 is connected in series between a third reference voltage VH and an output terminal OT. The switch SW2 is turned on or off according to a control signal EN_SW2. The switch SW1 is connected in series between the ground voltage VGND and the output terminal OT. The switch SW1 is turned on or off according to a control signal EN_SW1. The switch SW3 is coupled between the output terminal OT and the second clamping voltage VG_CLP, and is turned on or off according to the control signal EN_SW3. The positive and negative input terminals of the operational amplifier OP1 respectively receive the second reference voltage (that is, the regulated voltage) VDS_REG and the voltage difference VDS.

As in the waveform of FIG. 6, when the first time point TP1 is detected, in the first time interval TZ1, the gate voltage control circuit 700 turns on the switch SW2 via the control signal EN_SW2, and turns off the switch SW1 via the control signal EN_SW1; and the operational amplifier OP1 is disabled via the control signal EN_OPA. At this time, the gate voltage VG is equal to the third reference voltage VH and has a voltage value high enough to turn on the transistor TD1.

During the second time interval TZ2 after the end of the first time interval TZ1, the gate voltage control circuit 700 turns off the switches SW1, SW2, and SW3 respectively via the control signals EN_SW1, EN_SW2, and EN_SW3, and activates the operational amplifier OP1 via the control signal EN_OPA. During the second time interval TZ2, the operational amplifier OP1 generates the gate voltage VG according to the difference between the second reference voltage VDS_REG and the voltage difference VDS, and controls the transistor TD1 to set the voltage difference VDS in a steady state to the second reference voltage VDS_REG.

During the third time interval TZ3, the voltage difference VDS gradually rises according to the decreasing current flowing through the transistor TD1. The gate voltage control circuit 700 then detects the second time point TP2 when the voltage difference VDS is equal to the first clamping voltage VDS_CLP. The gate voltage control circuit 700 further turns on the switch SW3 (the switches SW1 and SW2 are turned off, and the operational amplifier OP1 is disabled) via the control signal EN_SW3 during the fourth time interval TZ4 which is after the second time point TP2. The gate voltage VG is set to be equal to the second clamping voltage VG_CLP via the turned-on switch SW3.

During the fifth time interval TZ5 which is after the fourth time interval TZ4, the switch SW1 to the switch SW3 are all turned off, whereas the operational amplifier OP1 is activated. During the fifth time interval TZ5, via the gate voltage VG, the voltage difference VDS between the two ends of the transistor TD1 may be equal to the second reference voltage VDS_REG.

During the sixth time interval TZ6, the voltage difference VDS gradually rises according to the decreasing current flowing through the transistor TD1. The gate voltage control circuit 700 detects the third time point TP3 when the voltage difference VDS rises till it reaches the second preset threshold voltage VDS_OFF, and generates the control signal EN_SW1 according to the third time point TP3, such that the switch SW1 is turned on. At the same time, the switches SW2 and SW3 are turned off and the operational amplifier OP1 is disabled. This way, the transistor TD1 is turned off correspondingly.

Figure 8:
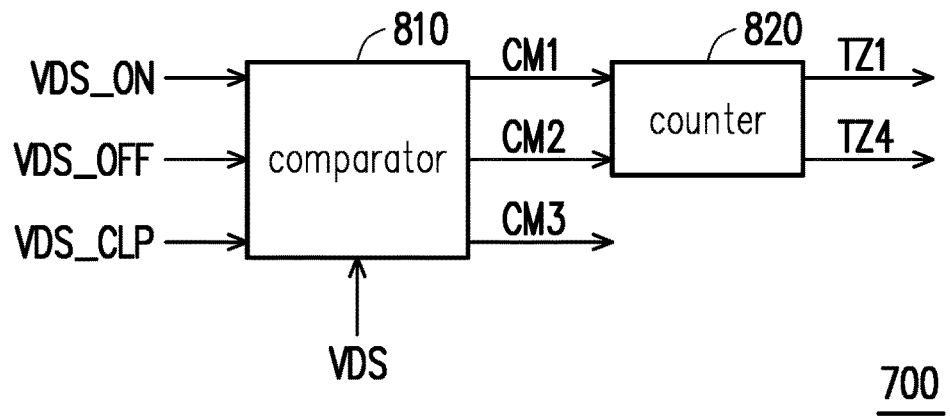
FIG. 8 is a schematic view of another part of the circuit of the gate voltage control circuit according to an embodiment of the present disclosure.

Please refer to FIG. 6, FIG. 7, and FIG. 8 at the same time. FIG. 8 is a schematic view of another part of the circuit of the gate voltage control circuit according to an embodiment of the present disclosure. In FIG. 8, the gate voltage control circuit 700 further includes a comparator 810 and a counter 820. The comparator 810 receives the first preset threshold voltage VDS_ON, the second preset threshold voltage VDS_OFF, the first clamping voltage VDS_CLP, and the voltage difference VDS. The comparator 810 compares the voltage difference VDS with the preset first preset threshold voltage VDS_ON, the second preset threshold voltage VDS_OFF, and the first clamping voltage VDS_CLP, and generates the comparison results CM1, CM3, and CM2, respectively. The comparison results CM1, CM3, and CM2 can be adapted to determine the first time point TP1, the third time point TP3, and the second time point TP2, respectively.

The counter 820 receives the comparison results CM1 and CM2, and performs the counting operation during the first time interval TZ1 after the first time point TP1, and performs the counting operation during the fourth time interval TZ4 after the second time point TP2. In addition, the gate voltage control circuit 700 may generate the control signals EN_SW1, EN_SW2, EN_SW3, and EN_OPA according to the first time interval TZ1, the fourth time interval TZ4, and the comparison result CM3.

Similarly, the circuit of the operational amplifier OP1 in this embodiment can be implemented by using a differential amplifier familiar to those skilled in the art. And the switches SW1, SW2, and SW3 in this embodiment may be configured by using electronic components well known in the semiconductor field (such as transistors). The disclosure has no specific restriction thereto.

Figure 9:
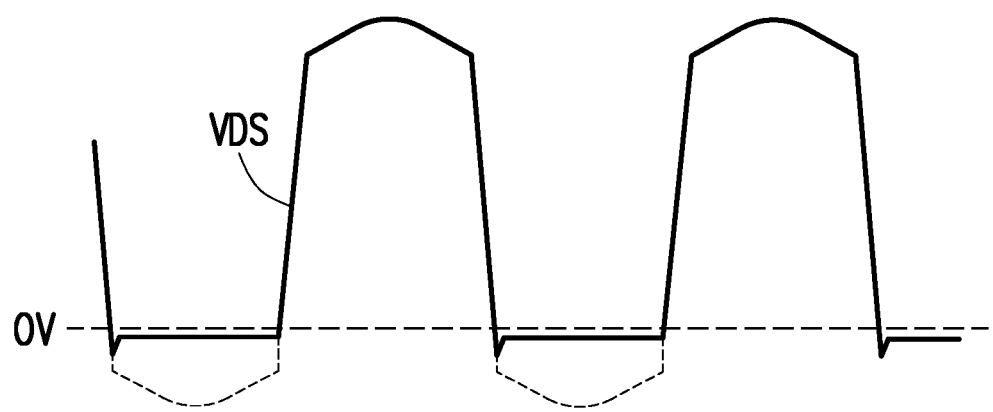
FIG. 9 is a schematic view of a waveform of a rectified voltage difference according to an embodiment of the present disclosure.

FIG. 9 is a schematic view of a waveform of a rectified voltage difference according to an embodiment of the present disclosure. In this embodiment, the rectifier keeps the rectified voltage difference VDS at a voltage value less than 0 volt during the negative half cycle. Specifically, taking the waveform of FIG. 3 as an example, the voltage value of the voltage difference VDS may be a negative voltage during the first time interval TZ1 and the second time interval TZ2. This way, the effect of negative current protection level can be achieved.

Figure 10:
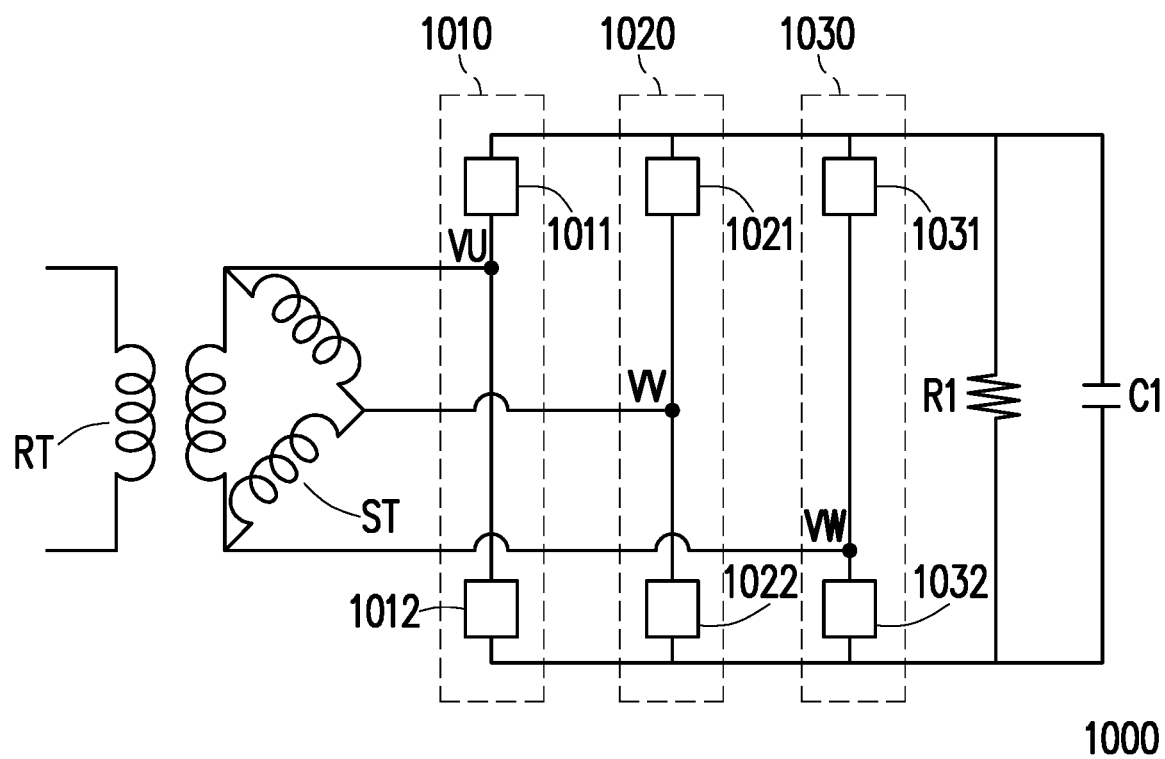
FIG. 10 is a schematic view of an alternator according to an embodiment of the present disclosure.

FIG. 10 is a schematic view of an alternator according to an embodiment of the present disclosure. An alternator 1000 includes a rotor RT, a stator ST, and a plurality of rectifiers 1011 to 1032. In this embodiment, the stator ST generates a plurality of phase voltages VU, VV, and VW. The phase voltages VU, VV, and VW are respectively provided to a plurality of rectifier circuits 1010, 1020, and 1030 of different phases. The rectifier circuit 1010 includes rectifiers 1011 and 1012 coupled in series. The rectifier circuit 1020 includes rectifiers 1021 and 1022 coupled in series. And the rectifier circuit 1030 includes rectifiers 1031 and 1032 coupled in series. In this embodiment, the alternator 1000 also includes a resistor R1 (an equivalent load or an equivalent resistance of a rechargeable battery) coupled in parallel and a capacitor C1 that is an equivalent charging capacitor to generate a rectified output voltage close to a DC voltage. The rectifiers 1011 to 1032 in this embodiment may be implemented by employing any of the rectifiers 200, 400, and 700 of the foregoing embodiments. Relevant details have been described in the aforementioned embodiments and implementations, which will not be repeated hereinafter.

In sum, the rectifier of the present disclosure turns on the transistor rapidly and keeps the same in the conducting state for a fixed first time interval after the first time point when the voltage difference is less than the first preset threshold voltage, preventing the poor efficiency of turning on the transistor too slowly. Also, in another embodiment of the present disclosure, the rectifier further compares the voltage difference with the first clamping voltage, and thereby slowing down the time point of turning off the transistor, preventing effectively the reverse current generated by turning off the transistor too slowly. In light of the above, the present disclosure regulates the time points of turning the transistor on and off effectively, and prevents the reverse current generated during the rectification, maintaining the performance of the system.

Although the disclosure has been disclosed by the above embodiments, they are not intended to limit the disclosure. To any one of ordinary skill in the art, modifications and embellishment to the disclosed embodiments may be made without departing from the spirit and the scope of the disclosure. Accordingly, the scope of the disclosure is defined by the claims attached below and their equivalents.

What is claimed is:

1. A rectifier, comprising:
   a transistor, comprising a first end receiving an AC input voltage, a second end generating a rectified voltage, and a control end receiving a gate voltage; and
   a gate voltage control circuit, coupled to the transistor, and generating the gate voltage according to a voltage difference between the input voltage and the rectified voltage,
   wherein: the gate voltage control circuit detects a first time point when the voltage difference is less than a first preset threshold voltage, provides the gate voltage during a first time interval after the first time point to turn on the transistor, and sets the voltage difference to be substantially equal to a first reference voltage; and the gate voltage control circuit regulates the gate voltage to set the voltage difference substantially to a second reference voltage during a second time interval after the first time interval, wherein the first time interval is independent of a cycle of the input voltage, wherein during a third time interval after the second time interval, the gate voltage control circuit detects a second time point when the voltage difference rises from the second reference voltage to a second preset threshold voltage, and regulates the gate voltage so that the transistor is turned off after the second time point.

2. The rectifier according to claim 1, wherein the first reference voltage is less than 0 volt.

3. The rectifier according to claim 1, wherein the gate voltage control circuit comprises:
an operational amplifier, receiving the voltage difference and a regulated voltage, activated during the second time interval, and generating the gate voltage according to the voltage difference and the regulated voltage;
a first switch, connected in series between a ground voltage and the output terminal, and turned on during the third time interval; and
a second switch, connected in series between a third reference voltage and the output terminal, and turned on during the first time interval,
wherein the regulated voltage is equal to the second reference voltage.

4. The rectifier according to claim 3, further comprising:
a voltage comparator, comparing the voltage difference with the first preset threshold voltage and the second preset threshold voltage, and generating the first time point and the second time point; and
a counter, counting the first time interval.

5. An alternator, comprising:
a rotor;
a stator, coupled to the rotor; and
the rectifiers according to claim 1, wherein each of the rectifiers receives the corresponding AC input voltage as the input voltage, and the rectifiers together generate the rectified voltage.

6. A rectifier, comprising:
a transistor, comprising a first end receiving an AC input voltage, a second end generating a rectified voltage, and a control end receiving a gate voltage; and
a gate voltage control circuit, coupled to the transistor, and generating the gate voltage according to a voltage difference between the input voltage and the rectified voltage,
wherein: the gate voltage control circuit detects a first time point when the voltage difference is less than a first preset threshold voltage, provides the gate voltage during a first time interval after the first time point to turn on the transistor, and sets the voltage difference to be substantially equal to a first reference voltage; and the gate voltage control circuit regulates the gate voltage to set the voltage difference substantially to a second reference voltage during a second time interval after the first time interval, wherein the first time interval is independent of a cycle of the input voltage, wherein, during a third time interval after the second time interval, the gate voltage control circuit detects a second time point when the voltage difference rises from the second reference voltage to a first clamping voltage, and the gate voltage control circuit sets the gate voltage to be equal to a second clamping voltage during a fourth time interval after the second time point.

7. The rectifier according to claim 6, wherein the gate voltage control circuit regulates the gate voltage during a fifth time interval after the fourth time interval, so that the voltage difference is substantially equal to the second reference voltage.

8. The rectifier according to claim 7, wherein during a sixth time interval after the fifth time interval, the gate voltage control circuit detects a third time point when the voltage difference rises from the second reference voltage to a second preset threshold voltage, and regulates the gate voltage after the third time point such that the transistor is turned off.

9. The rectifier according to claim 8, wherein the gate voltage control circuit comprises:
an operational amplifier, receiving the voltage difference and a regulated voltage, activated during the second time interval and the fifth time interval, and generating the gate voltage according to the voltage difference and the regulated voltage;
a first switch, connected in series between a ground voltage and an output terminal, and turned on during the third time interval;
a second switch, connected in series between a third reference voltage and the output terminal, and turned on during the first time interval; and
a third switch, connected in series between the second clamping voltage and the output terminal, and turned on during the fourth time interval,
wherein the regulated voltage is equal to the second reference voltage.

10. The rectifier according to claim 8, wherein the gate voltage control circuit further comprises:
a voltage comparator, comparing the voltage difference with the first preset threshold voltage, the first clamping voltage, and the second preset threshold voltage, and generating the first time point, the second time point, and the third time point; and
a counter, counting the first time interval and the fourth time interval.

* * * * *